(12) United States Patent
Killat

(10) Patent No.: US 6,704,221 B2
(45) Date of Patent: Mar. 9, 2004

(54) FLOATING GATE PROGRAMMABLE CELL ARRAY FOR STANDARD CMOS

(75) Inventor: Dirk Killat, Kircheim/ Teck-Nabern (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 179 days.

(21) Appl. No.: 10/005,805

(22) Filed: Dec. 5, 2001

(65) Prior Publication Data

US 2003/0081455 A1 May 1, 2003

(30) Foreign Application Priority Data

Oct. 29, 2001 (EP) .............................. 01640004

(51) Int. Cl.$^7$ ............................... G11C 16/04
(52) U.S. Cl. .............. 365/185.01; 365/149; 365/185.05
(58) Field of Search ................. 365/185.01, 185.05, 365/185.1, 185.26, 149

(56) References Cited

U.S. PATENT DOCUMENTS

| | | | | |
|---|---|---|---|---|
| 5,481,492 A | * | 1/1996 | Schoemaker | 365/185.23 |
| 5,615,150 A | | 3/1997 | Lin et al. | 365/185.17 |
| 5,646,901 A | | 7/1997 | Sharpe-Geisler et al. | 365/218 |
| 5,663,907 A | | 9/1997 | Frayer et al. | 365/185.18 |
| 5,754,471 A | | 5/1998 | Peng et al. | 365/185.1 |
| 5,835,402 A | | 11/1998 | Rao et al. | 365/149 |

OTHER PUBLICATIONS

Ohsaki et al., "A Single Poly EEPROM Cell Structure for Use in Standard CMOS Processes," Journal of Solid–State Circuits, vol. 29, No. 3, Mar. 1994, pp. 311–316.
Harrison et al., "A CMOS Programmable Analog Memory–Cell Array Using Floating–Gate Circuits", IEEE Transactions on Circuits and Systems II, vol. 48, No. 1, Jan. 2001, pp. 4–11.
Hasler et al., "Overview of Floating–Gate Devices, Circuits, and Systems, " IEEE Transactions on Circuits and Systems II, vol. 48, No. 1, Jan. 2001, pp. 1–3.

* cited by examiner

Primary Examiner—Vu A. Le
(74) Attorney, Agent, or Firm—George O. Saile; Stephen B. Ackerman; Douglas R. Schnabel

(57) ABSTRACT

A new floating gate programmable device cell is achieved. The device comprises, first, a negative injection transistor having drain, source, bulk, and gate. The source and bulk are coupled to ground. The drain forms an output of the cell. A positive injection transistor has drain, source, bulk, and gate. The drain, source, and bulk are coupled to a programming voltage. The gate is coupled to the negative injection transistor gate to form a floating gate node. Finally, a capacitor has a first terminal coupled to the floating gate node and a second terminal coupled to a control voltage. The states of the programming voltage and the control voltage determine negative charge injection onto the floating gate node and positive charge injection onto the floating gate node. A voltage on the floating gate node comprises a nonvolatile memory state that is detectable by the impedance of the output.

25 Claims, 4 Drawing Sheets

FLOATING GATE PROGRAMMABLE CELL ARRAY FOR STANDARD CMOS

BACKGROUND OF THE INVENTION

(1) Field of the Invention

The invention relates to a floating gate programmable device circuit, and more particularly, to a floating gate device using charge injection.

(2) Description of the Prior Art

EEPROM, Flash, and other programmable devices are integrated onto integrated circuit devices commonly in the art. These devices present several difficulties for integration. One of the chief problems is that the programming voltages are typically much larger than the operation voltages of the typical device technologies. For example, a 0.35 micron CMOS technology may have an operating voltage of between about 3 Volts and about 5 Volts. The gate breakdown voltage is about 7.5 Volts for a gate oxide thickness of about 7.5 nanometeres. Meanwhile the programming voltage for an EEPROM cell may be greater than about 11 Volts.

To provide some form of integrated circuit programmability, fuse devices are sometimes used. A fuse device, typically of polysilicon, can be selectively blown or not blown during a programming operation. This approach only provides a one-time programmability for the integrated circuit device. Providing a programmable device that can be re-programmed and that is programmable with low voltage CMOS circuitry represents a needed advancement in the art.

Several prior art inventions describe nonvolatile storage devices. U.S. Pat. No. 5,835,402 to Rao et al describes circuits for non-volatile storage on a CMOS IC. Low voltage devices are used to program and erase cells using high voltage. U.S. Pat. No. 5,663,907 to Frayer et al teaches a circuit for programming EEPROM cells with high voltage. In addition, Ohsaki et al, "A Single Poly EEPROM Cell Structure for Use in Standard CMOS Processes," Journal of Solid-State Circuits, Vol. 29, No. 3, pp. 311–316, discloses a nonvolatile device structure. In Harrison et al, "A CMOS Programmable Analog Memory-Cell Array Using Floating-Gate Circuits, IEEE Transactions on Circuits and Systems II, Vol. 48, No. 1, 2001, pp. 4–11, nonvolatile "e-pots" are described. Finally, in Hasler et al, "Overview of Floating-Gate Devices, Circuits, and Systems," IEEE Transactions on Circuits and Systems II, Vol. 48, No. 1, 2001, pp. 1–3, several floating gate devices and applications are disclosed.

SUMMARY OF THE INVENTION

A principal object of the present invention is to provide an effective and very manufacturable floating gate programmable device circuit.

A further object of the present invention is to provide a floating gate programmable device which can be programmed using low voltage CMOS devices.

Another still further object of the present invention is to provide a floating gate programmable device which can be integrated into a standard CMOS process.

In accordance with the objects of this invention, a floating gate programmable device cell is achieved. The device comprises, first, a negative injection transistor having drain, source, bulk, and gate. The source and bulk are coupled to ground. The drain forms an output of the cell. A positive injection transistor has drain, source, bulk, and gate. The drain, source, and bulk are coupled to a programming voltage. The gate is coupled to the negative injection transistor gate to form a floating gate node. Finally, a capacitor has a first terminal coupled to the floating gate node and a second terminal coupled to a control voltage. The states of the programming voltage and the control voltage determine negative charge injection onto the floating gate node and positive charge injection onto the floating gate node. A voltage on the floating gate node comprises a nonvolatile memory state that is detectable by the impedance of the output.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a floating gate programmable device circuit. It should be clear to those experienced in the art that the present invention can be applied and extended without deviating from the scope of the present invention.

Figure 1:
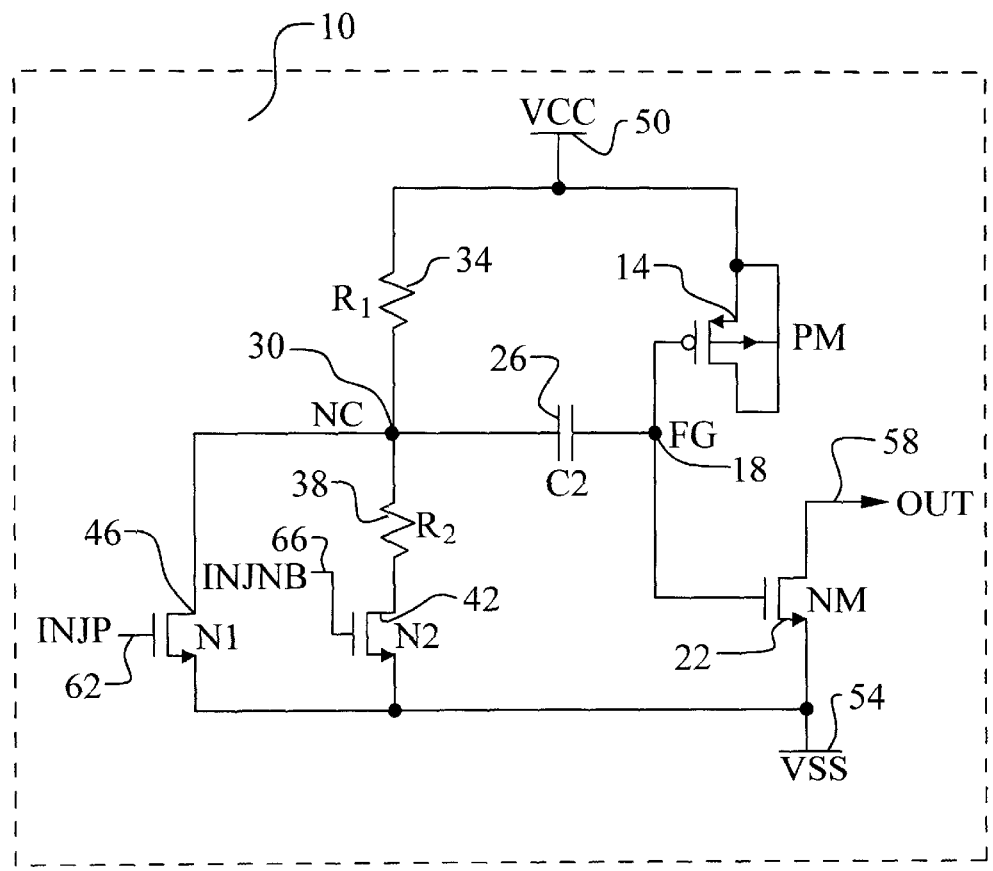
FIG. 1 illustrates the first preferred embodiment of the present invention.

Referring now to FIG. 1, a first preferred embodiment of the present invention is illustrated. Several important features of the present invention are shown. A single floating gate programmable (FGP) device cell 10 is shown. In practice, many such FGP cells 10 could be used on a single integrated circuit device to implement a larger array of memory cells.

The memory cell 10 comprises, a negative charge injection transistor, NM 22, that preferably can be in either of two states, ON or OFF. Alternatively, NM 22 can be in analog medium states, too. Up to 13 bit resolution of analog states is possible as disclosed in Harrison et al, "A CMOS Programmable Analog Memory-Cell Array Using Floating-Gate Circuits, IEEE Transactions on Circuits and Systems II, Vol. 48, No. 1, 2001, pp. 4–11. In the first preferred embodiment, the negative charge injection transistor comprises an NMOS transistor, NM 22, with gate coupled to the floating gate node FG 18. The source of NM 22 is coupled to the lower rail, or VSS 54, node. The drain of NM 22 is the output of the memory cell, OUT 58. The state of NM 22 is controlled by the voltage level on FG 18. This FG 18 voltage level is, in turn, controlled by the remaining components of the circuit cell 10. Altogether, one electrode of C2 26, the gate of NM 22, and the gate of PM 14 form the information storage node.

A positive charge injection transistor is preferably implemented as a PMOS transistor PM 14. PM 22 has the source, drain, and bulk coupled to the first rail or VCC 50. The gate of PM 22 is coupled to FG 18. A capacitor, C2 26, has a first terminal coupled to FG 18. The second terminal of C2 26 is coupled to the NC 30. A first resistor R1 34 has a first terminal coupled to the first rail or VCC 50. The second terminal of the R1 34 is coupled to NC 30. A second resistor R2 38 has a first terminal coupled to NC 30.

A positive injection control transistor N1 46 preferably comprises an NMOS transistor with drain coupled to NC 30 and source coupled to the second rail or VSS 54. The positive injection control transistor N1 46 is controlled by a programming signal INJP 62 that is coupled to the gate. A negative injection control transistor N2 42 preferably comprises an NMOS transistor with drain coupled to the second terminal of R2 38 and source coupled to the second rail or VSS 54. The negative injection control transistor N2 42 is controlled by a programming signal INJNB 66 that is coupled to the gate.

Preferably, the charge injection transistors NM 22 and PM 14 comprise low voltages devices such as those for a 3.3 Volt CMOS process where the gate break down voltage is about 7.5 Volts. The injection control transistors N1 46 and N2 42 preferably comprise higher voltage devices such as 5 Volt devices. Alternatively, N1 and N2 may comprise even higher voltage devices or even cascaded devices to allow switching of the VCC voltage.

Resistors R1 34 and R2 38 and transistors N1 46 and N2 42 form a variable voltage divider that is a first key to the operation of the cell. The variable voltage divider operates in three states. In the first state, transistor N1 46 is not conducting and N2 42 is conducting. This is the non-programming state. In this state, the voltage divider of R1 and R2 causes NC 30 to be pulled to about VCC/2. If the VCC 50 programming voltage is high impedance or not applied in this non-programming state, then the cell will hold its programmed value. If VCC is applied, then the cell enters programming mode.

In the second state, N1 46 is conducting while N2 42 is not conducting. The voltage of the NC 30, is pulled down to nearly the VSS voltage 54. If the VCC voltage is applied such that the circuit enters programming mode, then the low voltage on NC 30 will cause the gate-to-source breakdown of transistor PM 14. Source-side positive charge injection from PM 14 will cause FG to be charged positively. When VCC is removed, the charge remains. The charged state of FG 18 causes NM 22 to conduct current if a current source is applied at OUT 58.

In the third state of operation, N1 46 is not conducting and N2 42 is not conducting. If VCC is applied, the NC 30 voltage will equal VCC. In this state, a gate-to-source breakdown occurs on NM 22 causing source-side injection of negative charge onto FG. The negative charging of FG is maintained after VCC is removed and causes NM 22 to be non-conducting when a current source is coupled to OUT 58.

Note that NM 22 is used for both negative charge injection and for sensing in this embodiment. PM 14 is used only for positive charge injection. However, PM 14 could be used for sensing as well if the drain of PM 14 is coupled to an output node. Capacitor C2 26 should be larger than the gate capacitance of PM and NM. C2 may be a parallel plate capacitor such as poly-oxide-poly. Optionally, C2 may be a PMOS transistor if the capacitance is large enough.

It is found that the gate oxide of the injection transistors NM 22 and PM 14 provide excellent long term stability and maximum read-write cycles because of the dry oxide process used in the gate oxide formation. For C2 26 a stack of poly-ONO-poly could be used. ONO provides low tunnel current and a high barrier. The resistors R1 34 and R2 38 may comprise n-well, n+, p+, lightly doped polysilicon, highly doped polysilicon, long channel MOS in well (PMOS), or MOS transistor current sources with cascodes to shield the large voltage.

The programming voltage VCC follows the formula:

$$C2/(C2+C_{NM}+C_{PM}) > V_{BROXIDE}/VCC.$$

Typically, $V_{BROXIDE}$, or the oxide breakdown voltage of PM 14 and NM 22, is about 7.5 Volts. In this case, VCC should equal about 8.5 Volts. This VCC of about 8.5 Volts is below the junction breakdown voltage $V_{BRJUNCTION}$ of about 9 Volts. The preferred ratio of R1 34 and R2 38 is about 1:1. The capacitance of PM 14 and NM 22 is kept as low as possible. Hence, the capacitive divider comprising C2, PM, and NM has all of the voltage drop on either PM or NM.

Figure 2:
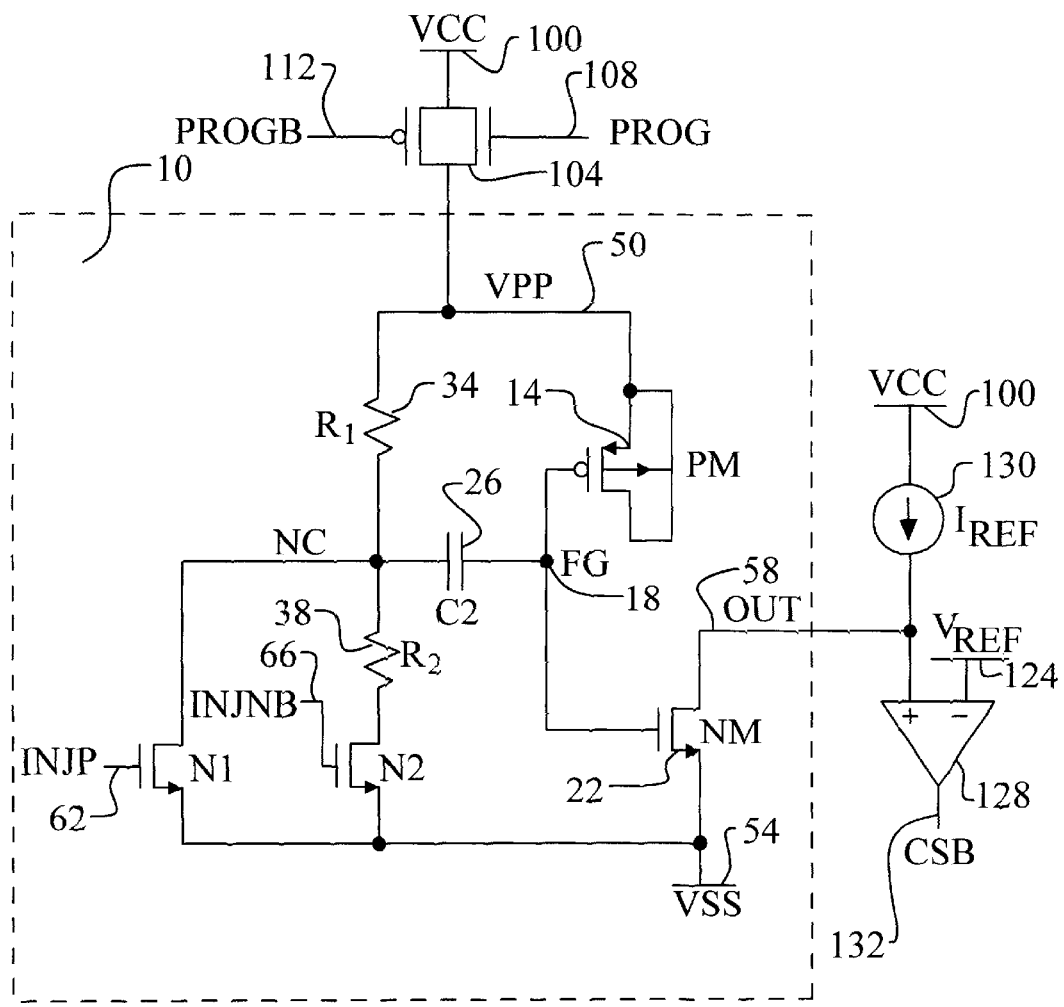
FIG. 2 illustrates the first preferred embodiment of the present invention including a state sensing circuit and a means to switch the positive power supply to high impedance.

Referring now to FIG. 2 the first preferred embodiment of the present invention is illustrated including a state sensing circuit and a means to switch the positive power supply to high impedance. The variable output impedance of the memory cell output, OUT 58, is used to convey the state of the cell 10 to the sense circuit. The sense circuit may comprise, for example, a constant current source element, IREF 130, a constant voltage reference, VREF 124, and a comparitor means 128. In the low output impedance state, when FG 18 is high and NM 22 is ON, the constant current IREF 130 induces only a small voltage drop on OUT 58. In this case OUT 58 is less than VREF 124 and the cell state bar or CSB 132 is low. In the high impedance state, when FG 18 is low and NM 22 is OFF, the current source IREF 130 induces a large voltage drop on OUT 58. In this case, OUT58 exceeds VREF 124 and CSB is driven high by the comparitor.

A second optional feature of the present invention is shown as the pass gate 104. It is necessary to make the programming voltage VCC 100 switch from low impedance, during programming, to high impedance, during non-programming. The pass gate 104 may be controlled by a program enable signal, PROG 108 and PROGB 112. Any charging path of FG 18 to VCC 100 through the R-C network comprising R1, C2, and PM, is thereby eliminated.

Figure 3:
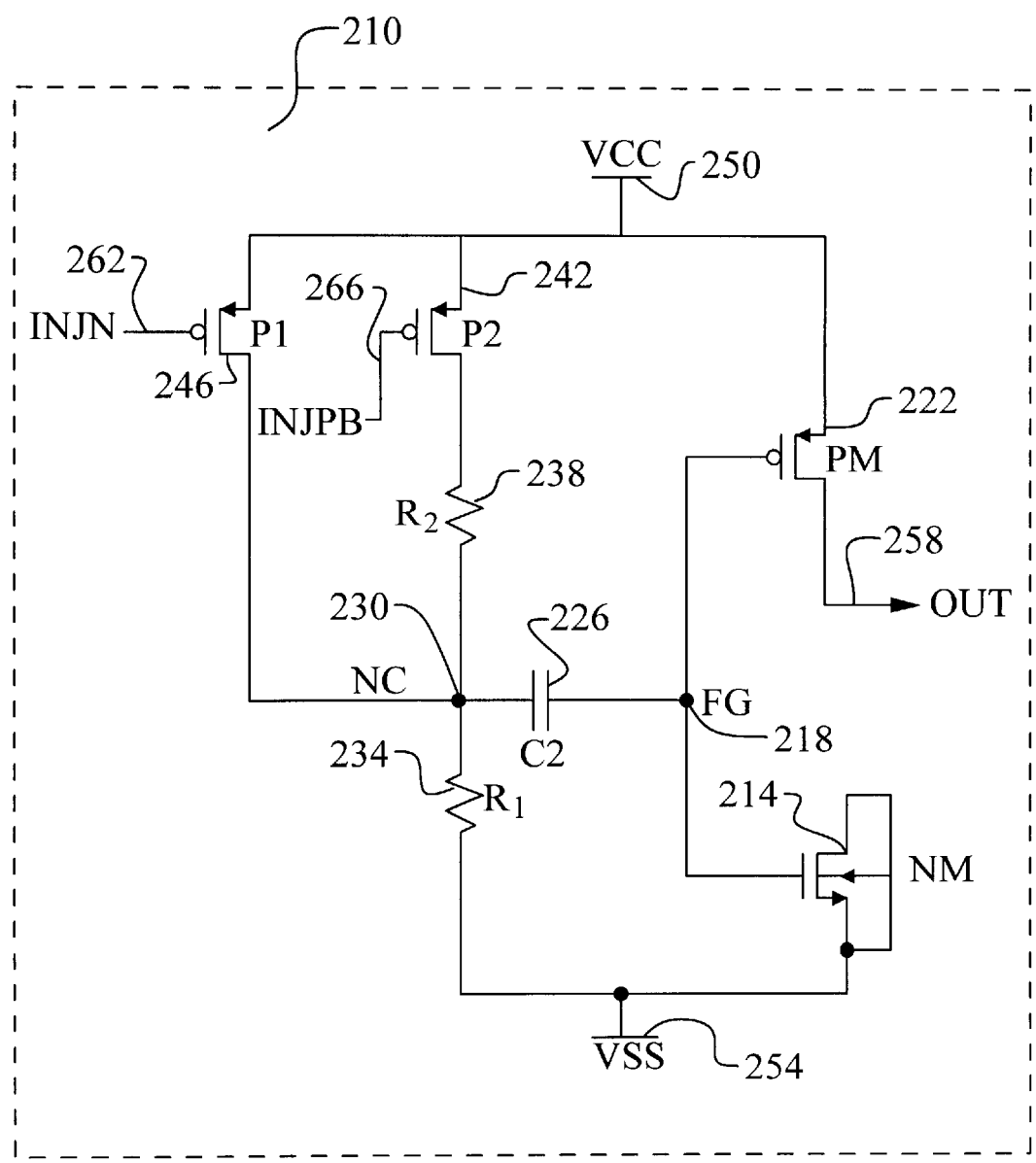
FIG. 3 illustrates a second preferred embodiment of the present invention.

Referring now to FIG. 3, a second preferred embodiment of the present invention is illustrated. In this embodiment, the FGP cell 210 is inverted. The NMOS transistors, N1, N2, and NM, of the first embodiment are replaced with PMOS transistors, P1 246, P2, 242, and PM 222. The PMOS transistor, PM, of the first embodiment is replaced with the NMOS transistor, NM 214.

In the second embodiment, the positive injection transistor PM 222 also serves as the sensing transistor. The negative injection transistor is NM 214. The principle of operation of the second embodiment is essentially the same as that of the first embodiment. NC 230 is either at VCC/2 (non-programming), VCC (negative injection), or VSS (positive injection). The charge state of FG is detected by the conducting or non-conducting state of PM 222 when a current sink is applied to OUT 258.

Figure 4:
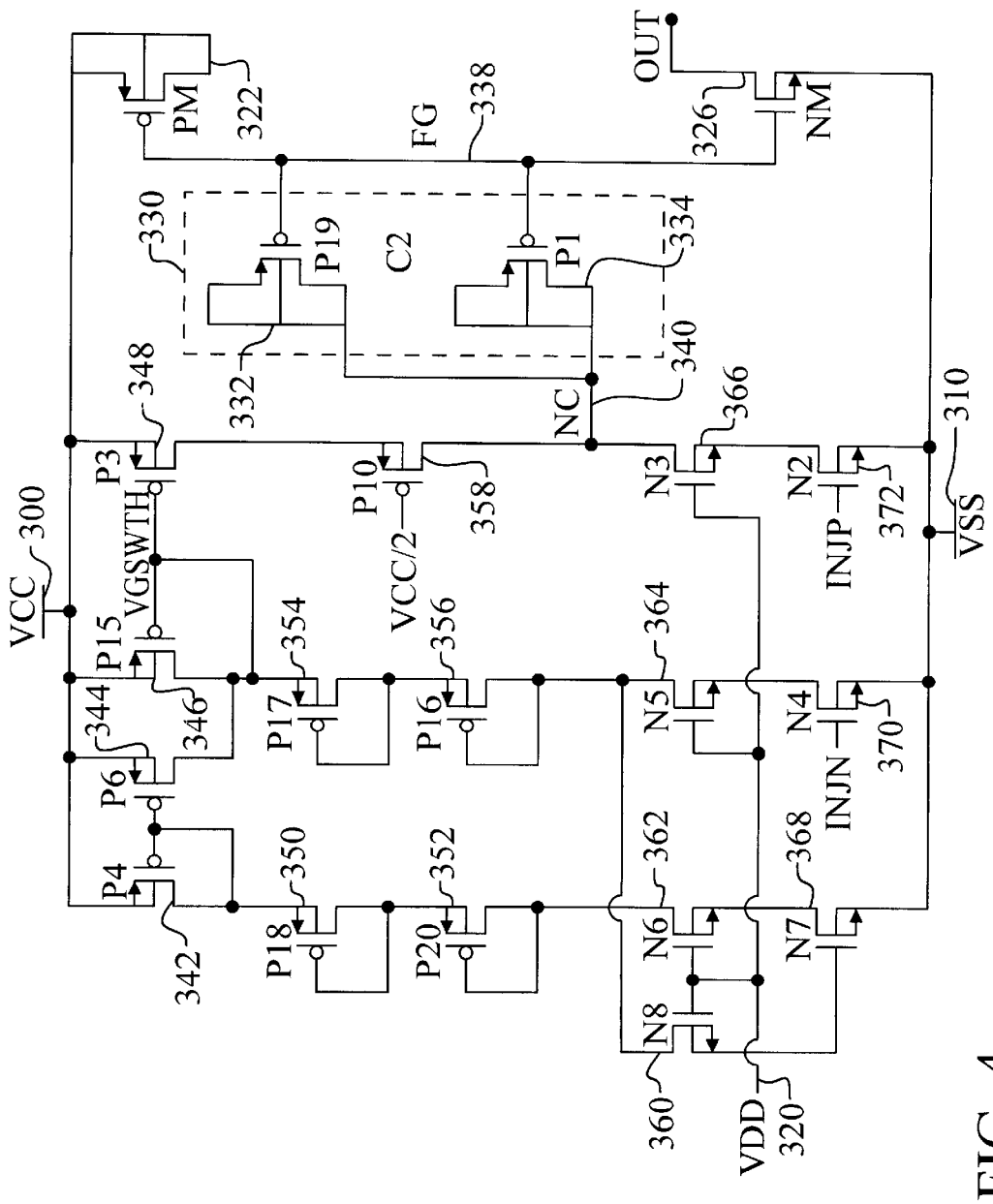
FIG. 4 illustrates a third preferred embodiment of the present invention.

Referring now to FIG. 4, a third preferred embodiment of the present invention is illustrated. In this embodiment, cascaded devices are used to shield drains from the large VCC 300 voltage. For example, NMOS transistors N8 360, N6 362, N5 364, and N3 366, protect transistors N7 368, N5 364, and N2 372 from excessive drain voltage. Similarly, PMOS transistors P16 356, P17 354, P18 350, and P20 352 limit or reduce the voltages across N6, N5, P4 342, P6 344, and P15 346.

The capacitor C2 330 is implemented as the combination of two PMOS transistors P1 334 and P19 332 to achieve a large capacitance value. A larger coupling capacitor C2 reduces the needed programming voltage VCC 300.

Transistor N2 372 is the positive injection control transistor. Transistor N4 370 is the negative injection control transistor. When INJP is high and INJN is low, N2 is conducting and pulls NC 340 to VSS 310. This causes positive charge injection on FG 338 due to the break down of the positive injection transistor PM 322. When INJN is high and INJP is low, N4 is conducting and induces a current through P15 346. This current is mirrored to P3 348 and causes NC 340 to be pulled up to VCC 300. Negative charge is injected into FG 338 via breakdown of NM 326.

Note that NMOS transistors N6 362, N7 368, and N8 360 form an "inverted current mirror." If INJN is low, N4 370 is OFF and a current will flowing through N8 to the gate of N7. This causes transistor N7 to switch ON and source current to the current mirror formed by P4 342 and P6 344. This, in turn, causes the node VGSSWTH to be pulled up to VCC 300 and cutoff the current source P3 348. In this way, a feedback mechanism is established such that the pullup current for NC 340 is only turned ON when N4 is ON. This is a feature of this embodiment of the present invention.

The advantages of the present invention may now be summarized. First, an effective and very manufacturable floating gate programmable device has been achieved. Second, the floating gate programmable device that can be programmed using low voltage CMOS devices. Finally, the floating gate programmable device can be integrated into a standard CMOS process.

As shown in the preferred embodiments, the novel current sense circuit provides an effective and manufacturable alternative to the prior art.

While the invention has been particularly shown and described with reference to the preferred embodiments thereof, it will be understood by those skilled in the art that various changes in form and details may be made without departing from the spirit and scope of the invention. It should be understood that it is possible to change the NMOS devices of the embodiments to PMOS devices, and visa versa, and to change the polarity of the voltages while achieving the same essential features of the present invention.

What is claimed is:

1. A floating gate programmable device cell comprising:
   a negative injection transistor having drain, source, bulk, and gate, wherein said source is coupled to ground and wherein said drain forms an output of said cell;
   a positive injection transistor having drain, source, bulk, and gate, wherein said drain, source, and bulk are coupled to a programming voltage and wherein said gate is coupled to said negative injection transistor gate to form a floating gate node; and
   a capacitor having a first terminal coupled to said floating gate node and a second terminal coupled to a control voltage wherein the states of said programming voltage and said control voltage determine negative charge injection onto said floating gate node and positive charge injection onto said floating gate node and wherein a voltage on said floating gate node comprises a nonvolatile memory state that is detectable by the impedance of said output.

2. The cell according to claim 1 wherein said negative injection transistor comprises a NMOS transistor and said positive injection transistor comprises a PMOS transistor.

3. The cell according to claim 1 wherein said capacitor comprises a MOS transistor having gate coupled to said floating gate node and drain, source, and bulk coupled to said control node.

4. The cell according to claim 1 wherein said capacitor comprises a dielectric consisting of one of the group of: gate oxide and oxide-nitride-oxide.

5. The cell according to claim 1 wherein said control node is coupled to said programming voltage to cause negative injection, is coupled to said ground to cause positive injection, and is coupled to a high impedance to cause no charge injection.

6. The cell according to claim 1 further comprising:
   a first resistor having first and second terminals wherein said first terminal is coupled to said programming voltage and said second terminal is coupled to said control node;
   a second resistor having first and second terminals wherein said first terminal is coupled to said control node;
   a positive injection control transistor having a drain, a source, and a gate wherein said drain is coupled to said control node and said source is coupled to said ground; and
   a negative injection control transistor having a drain, a source, and a gate wherein said drain is coupled to said second terminal of said second resistor and said source is coupled to said ground.

7. The cell according to claim 1 further comprising:
   a first resistor having first and second terminals wherein said first terminal is coupled to said ground and said second terminal is coupled to said control node;
   a second resistor having first and second terminals wherein said first terminal is coupled to said control node;
   a negative injection control transistor having a drain, a source, and a gate wherein said drain is coupled to said control node and said source is coupled to said programming voltage; and
   a positive injection control transistor having a drain, a source, and a gate wherein said drain is coupled to said second terminal of said second resistor and said source is coupled to said programming voltage.

8. The cell according to claim 1 further comprising:
   a positive injection control transistor having a drain, a source, and a gate wherein said drain is coupled to said control node and said source is coupled to said ground and wherein said positive injection control transistor pulls said control node to ground when turned ON;
   a switchable current source coupled to said control node wherein said switchable current source pulls said control node to said programming voltage when turned ON; and
   a negative injection control transistor having a drain, a source, and a gate wherein said drain is coupled to said switchable current source and wherein said switchable current source is turned ON when said negative injection control transistor is turned ON.

9. The cell according to claim 1 further comprising a means to switch OFF said programming voltage.

10. A floating gate programmable device cell comprising:
   a positive injection transistor having drain, source, bulk, and gate, wherein said source is coupled to a programming voltage and wherein said drain forms an output of said cell;
   a negative injection transistor having drain, source, bulk, and gate, wherein said drain, source, and bulk are coupled to ground and wherein said gate is coupled to said positive injection transistor gate to form a floating gate node; and
   a capacitor having a first terminal coupled to said floating gate node and a second terminal coupled to a control voltage wherein the states of said programming voltage and said control voltage determine negative charge injection onto said floating gate node and positive charge injection onto said floating gate node and wherein a voltage on said floating gate node comprises a nonvolatile memory state that is detectable by the impedance of said output.

11. The cell according to claim 10 wherein said negative injection transistor comprises a NMOS transistor and said positive injection transistor comprises a PMOS transistor.

12. The cell according to claim 10 wherein said capacitor comprises a MOS transistor having gate coupled to said floating gate node and drain, source, and bulk coupled to said control node.

13. The cell according to claim 10 wherein said capacitor comprises a dielectric consisting of one of the group of: gate oxide and oxide-nitride-oxide.

14. The cell according to claim 10 wherein said control node is coupled to said programming voltage to cause negative injection, is coupled to said ground to cause positive injection, and is coupled to a high impedance to cause no charge injection.

15. The cell according to claim 10 further comprising:
a first resistor having first and second terminals wherein said first terminal is coupled to said programming voltage and said second terminal is coupled to said control node;
a second resistor having first and second terminals wherein said first terminal is coupled to said control node;
a positive injection control transistor having a drain, a source, and a gate wherein said drain is coupled to said control node and said source is coupled to said ground; and
a negative injection control transistor having a drain, a source, and a gate wherein said drain is coupled to said second terminal of said second resistor and said source is coupled to said ground.

16. The cell according to claim 10 further comprising:
a first resistor having first and second terminals wherein said first terminal is coupled to said ground and said second terminal is coupled to said control node;
a second resistor having first and second terminals wherein said first terminal is coupled to said control node;
a negative injection control transistor having a drain, a source, and a gate wherein said drain is coupled to said control node and said source is coupled to said programming voltage; and
a positive injection control transistor having a drain, a source, and a gate wherein said drain is coupled to said second terminal of said second resistor and said source is coupled to said programming voltage.

17. The cell according to claim 10 further comprising:
a positive injection control transistor having a drain, a source, and a gate wherein said drain is coupled to said control node and said source is coupled to said ground and wherein said positive injection control transistor pulls said control node to ground when turned ON;
a switchable current source coupled to said control node wherein said switchable current source pulls said control node to said programming voltage when turned ON; and
a negative injection control transistor having a drain, a source, and a gate wherein said drain is coupled to said switchable current source and wherein said switchable current source is turned ON when said negative injection control transistor is turned ON.

18. The cell according to claim 10 further comprising a means to switch OFF said programming voltage.

19. A floating gate programmable device cell comprising:
a negative injection transistor having drain, source, bulk, and gate, wherein said source is coupled to ground and wherein said drain forms an output of said cell;
a positive injection transistor having drain, source, bulk, and gate, wherein said drain, source, and bulk are coupled to a programming voltage and wherein said gate is coupled to said negative injection transistor gate to form a floating gate node;
a capacitor having a first terminal coupled to said floating gate node and a second terminal coupled to a control voltage wherein the states of said programming voltage and said control voltage determine negative charge injection onto said floating gate node and positive charge injection onto said floating gate node and wherein a voltage on said floating gate node comprises a nonvolatile memory state that is detectable by the impedance of said output;
a positive injection control transistor having a drain, a source, and a gate wherein said drain is coupled to said control node and said source is coupled to said ground and wherein said positive injection control transistor pulls said control node to ground when turned ON;
a switchable current source coupled to said control node wherein said switchable current source pulls said control node to said programming voltage when turned ON; and
a negative injection control transistor having a drain, a source, and a gate wherein said drain is coupled to said switchable current source and wherein said switchable current source is turned ON when said negative injection control transistor is turned ON.

20. The cell according to claim 19 wherein said negative injection transistor comprises a NMOS transistor and said positive injection transistor comprises a PMOS transistor.

21. The cell according to claim 19 wherein said capacitor comprises a MOS transistor having gate coupled to said floating gate node and drain, source, and bulk coupled to said control node.

22. The cell according to claim 19 wherein said capacitor comprises a dielectric consisting of one of the group of: gate oxide and oxide-nitride-oxide.

23. The cell according to claim 19 wherein said control node is coupled to said programming voltage to cause negative injection, is coupled to said ground to cause positive injection, and is coupled to a high impedance to cause no charge injection.

24. The cell according to claim 19 further comprising a means to switch OFF said programming voltage.

25. The cell according to claim 19 further comprising cascading MOS transistors to increase operating range of said programming voltage.

* * * * *